(12) United States Patent
Chang et al.

(10) Patent No.: US 9,172,383 B2
(45) Date of Patent: Oct. 27, 2015

(54) INDUCTION-COUPLED CLOCK DISTRIBUTION FOR AN INTEGRATED CIRCUIT

(71) Applicant: BROADCOM CORPORATION, Irvine, CA (US)

(72) Inventors: David Chang, Irvine, CA (US); Ajat Hukkoo, Cupertino, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/027,079

(22) Filed: Sep. 13, 2013

(65) Prior Publication Data

US 2014/0210527 A1    Jul. 31, 2014

Related U.S. Application Data

(60) Provisional application No. 61/757,947, filed on Jan. 29, 2013, provisional application No. 61/804,595, filed on Mar. 22, 2013.

(51) Int. Cl.
  *H01L 23/02*  (2006.01)
  *H03L 7/06*  (2006.01)
  *G06F 1/10*  (2006.01)

(52) U.S. Cl.
  CPC ... *H03L 7/06* (2013.01); *G06F 1/10* (2013.01)

(58) Field of Classification Search
  CPC ........... H01L 2924/01078; H01L 2924/01079; H01L 2924/01029; H01L 25/0657; H01L 25/105; H03L 7/06

USPC ........ 257/678, 686, 777, 758, 692, 676, 684, 257/713
  See application file for complete search history.

(56) References Cited

U.S. PATENT DOCUMENTS

| | | |
|---|---|---|
| 5,627,733 A | 5/1997 | Bressler |
| 6,720,815 B2 * | 4/2004 | Mizuno ........................ 327/295 |
| 6,882,182 B1 | 4/2005 | Conn et al. |
| 7,579,691 B2 * | 8/2009 | Sukegawa et al. ............ 257/724 |
| 7,719,316 B2 | 5/2010 | Chueh et al. |
| 9,000,805 B2 | 4/2015 | Chang et al. |
| 2008/0068041 A1 | 3/2008 | Madurawe |
| 2014/0028344 A1 | 1/2014 | Penzes et al. |
| 2014/0035649 A1 | 2/2014 | Nedovic |

* cited by examiner

*Primary Examiner* — Hoa B Trinh
(74) *Attorney, Agent, or Firm* — Sterne, Kessler, Goldstein & Fox P.L.L.C.

(57) ABSTRACT

An integrated circuit package including an induction-coupled clock distribution system is disclosed. An exemplary embodiment of the disclosure includes a transmission module coupled to a main clock line, a clock reception module coupled to the transmission module, the clock reception module including a clock output line, and an electronic circuit coupled to the clock output line of the clock reception module, the electronic circuit including at least one clocked element and configured to operate synchronously with a clocking signal received through the clock output line of the clock reception module. The transmission module may be disposed on the supporting case of the IC package, and the electronic circuit and the clock reception module may be disposed on the semiconductor die of the IC package.

20 Claims, 5 Drawing Sheets

INDUCTION-COUPLED CLOCK DISTRIBUTION FOR AN INTEGRATED CIRCUIT

CROSS REFERENCE TO RELATED APPLICATIONS

The present application claims the benefit of U.S. Provisional Application No. 61/757,947, filed Jan. 29, 2013, and of U.S. Provisional Application No. 61/804,595, filed Mar. 22, 2013, and is related to U.S. patent application Ser. No. 13/849,115, filed Mar. 22, 2013, both of which are incorporated herein by reference in their entirety.

FIELD OF DISCLOSURE

Embodiments of the present disclosure relate generally to distribution of clocking signals in an integrated circuit (IC).

RELATED ART

In most situations, an integrated circuit (IC) includes multiple electronic circuits that are disposed onto a semiconductor substrate. In a synchronous IC, electronic circuits are ideally clocked by a simultaneous clock event, such as the leading edge of a clocking signal, and are expected to provide a stable output before the occurrence of a future simultaneous clock event. This allows a designer to precisely predict the behavior of the IC and to determine an appropriate frequency for the clocking signal.

However, practically, the simultaneous clock event does not reach all of the multiple electronic circuits of the IC simultaneously. Specifically, clock distribution paths between a clock unit, such as a phase lock loop (PLL) or a voltage controlled oscillator (VCO), and the multiple electronic circuits may cause the clocking signal to reach some of the multiple electronic circuits at different times. This may be caused by, for example, differences among the clock distribution paths, such as differences in length among the distribution paths and/or a number of intermediate buffers required to propagate the clocking signal through each of the distribution paths. The effect of these differences is generally known as clock skew phenomenon. In some situations, the clock skew phenomenon reduces performance of the IC by forcing a designer to operate the IC at a lower clock frequency than what would be possible in the absence of clock skew. In other situations, some of the multiple electronic circuits may not provide a stable output to other electronic circuits within the IC before the future simultaneous clock event, and thus, may cause performance failures.

BRIEF DESCRIPTION OF THE DRAWINGS

The accompanying drawings are incorporated herein and form a part of the specification.

In the drawings, like reference numbers generally indicate identical or similar elements. Additionally, generally, the leftmost digit(s) of a reference number identifies the drawing in which the reference number first appears.

DETAILED DESCRIPTION

The following Detailed Description refers to accompanying drawings to illustrate various exemplary embodiments. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

For purposes of this discussion, the term "module" shall be understood to include one of software, firmware, or hardware (such as one or more circuits, microchips, processors, or devices, or any combination thereof), and any combination thereof. In addition, it will be understood that each module can include one, or more than one, component within an actual device, and each component that forms a part of the described module can function either cooperatively or independently of any other component forming a part of the module. Conversely, multiple modules described herein can represent a single component within an actual device. Further, components within a module can be in a single device or distributed among multiple devices in a wired or wireless manner.

The various exemplary embodiments will so fully reveal the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Figure 5:
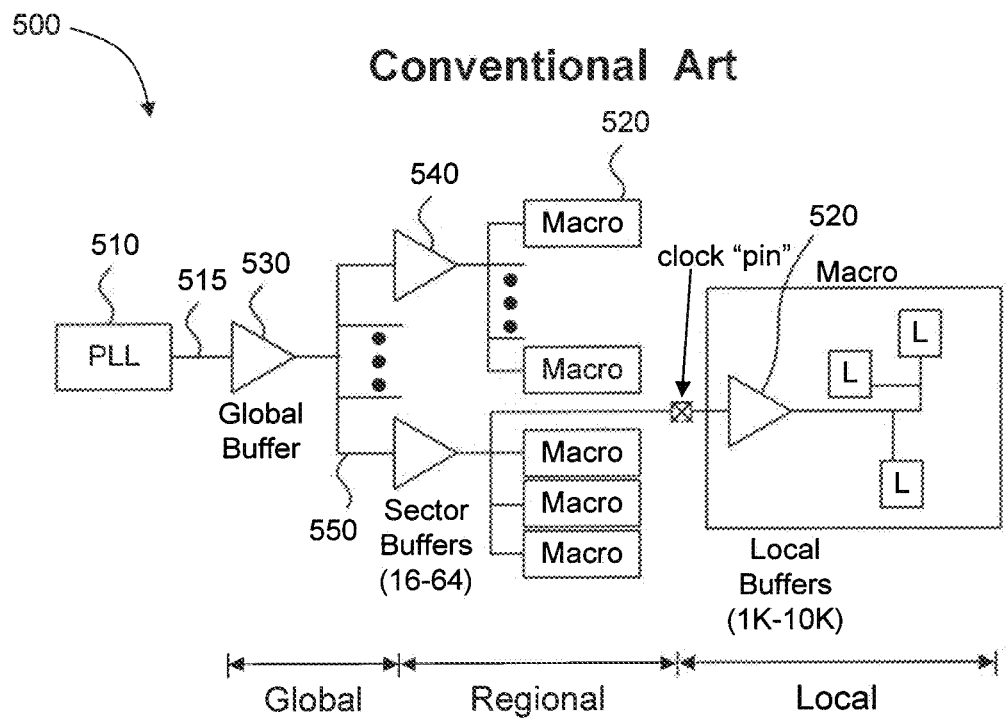
FIG. 5 is a block diagram of a conventional clock distribution system.

FIG. 5 is a diagram illustrating a conventional clock distribution system 500 of an IC. In this conventional system, a PLL 510 generates a master clocking signal to drive multiple electronic circuits, such as a plurality of macros 520, of the IC. In particular, the PLL 510 provides the master clocking signal to a global buffer 530 through a main clock line 515. The global buffer 530 provides a buffered clocking signal to a plurality of sector buffers 540 through a plurality of transmission lines 550 disposed on the IC semiconductor die. Each sector buffer 540 from among the plurality of sector buffers 540 is coupled to one or more macros 520 of the plurality of macros 520. In some situations, one or more of the plurality of macros 520 can additionally include a local buffer 560. Thus, in a conventional system, the master clocking signal propagates through a plurality of transmission lines, such as the plurality of transmission lines 550, and a plurality of buffers, such as the global buffer 530, a respective sector buffer 540 from among the plurality of sector buffers 540, and optionally a local buffer 560, before reaching the multiple electronic circuits therein.

In the illustrated example, a maximum of over 10,000 buffers may be necessary to provide the master clocking signal to the plurality of macros 520. However, for larger or more integrated ICs, the number of buffers may be significantly higher. Furthermore, in addition to the plurality of buffers, the plurality of transmission paths should be disposed in the semiconductor substrate to distribute the master clocking signal to the plurality of macros 520. Therefore, designers should carefully consider semiconductor die space and power consumption that needs to be allocated for these elements. Furthermore, clock skew may accumulate as the master clocking signal propagates through these elements, and thus, designers should carefully select, implement, and test a clock distribution configuration to manage and control clock skew.

Figure 6:
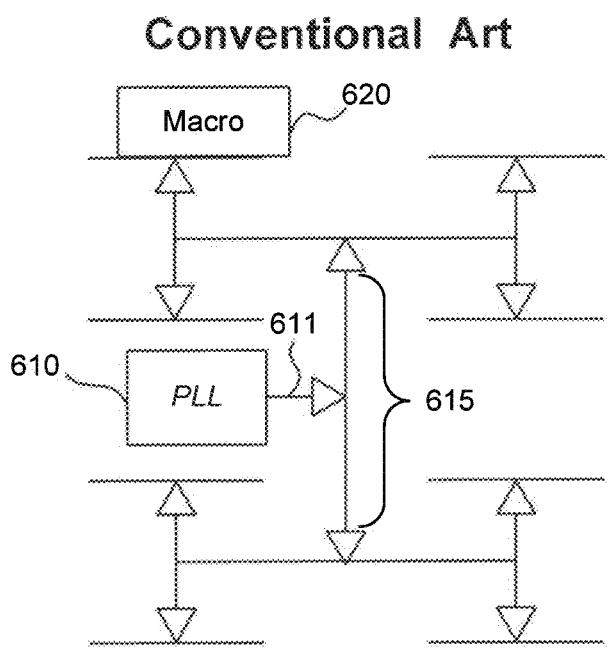
FIG. 6 is a diagram of a conventional H-tree configuration for a clock distribution system.

FIG. 6 is a diagram of a conventional H-tree clock distribution configuration. A PLL 610 generates a master clocking signal that may be distributed through a main clock line 611 and one or more buffers (not shown) to a central point 615 of the H-tree clock distribution configuration. The clocking signal is then distributed from the central point 615, along the H-tree clock distribution configuration, and possibly more buffers (not shown), towards a plurality of macros 620 at respective end points of the H-tree structure.

The H-tree clock distribution configuration reduces a difference between the plurality of paths between the PLL 610 and macros from among the plurality of macros 620, and thus, reduces the clock skew phenomenon. However, such configuration requires the buffers to carry the clocking signal through the H-tree structure towards each macro therein, which results in significant power consumption. Furthermore, the H-tree clock distribution configuration requires a significant amount of transmission lines, which, together with the required buffers, account for a significant portion of the IC's semiconductor die area. Finally, such configuration does not completely eliminate clock skew, as slight variations for each path may still result in significant clock skew.

In exemplary embodiments of the present disclosure, an integrated circuit (IC) includes multiple electronic circuits that are formed onto a semiconductor substrate and an IC clock distribution system for distributing one or more clocking signals to the multiple electronic circuits. The IC clock distribution system includes one or more coupling elements, such as inductors or capacitors to provide some examples, to inductively and/or capacitively distribute the one or more clocking signals to the multiple electronic circuits. In particular, a master clocking signal, from a PLL or a VCO to provide some examples, is provided to a first transmission (TX) module, including a TX coil, within the IC clock distribution system. The master clocking signal causes a magnetic field and/or an electrical field that is representative of the master clocking signal to emanate from the TX module. The magnetic field and/or an electrical field induces a current and/or a voltage onto one or more second clock reception (RX) modules, including a RX coil, within the IC clock distribution system, thus generating the one or more clocking signals. The one or more clocking signals can be used to drive, either independently or through an amplifier buffer, the multiple electronic circuits. Thus, in the exemplary embodiments, because the magnetic field and/or an electrical field induce the current and/or the voltage onto multiple clock RX modules virtually simultaneously, clock skew is significantly reduced.

In a particular exemplary embodiment, the one or more RX modules may be part of one or more respective resonant circuits within the IC clock distribution system, and the induced current and/or voltage may cause their respective resonant circuits to resonate to generate the one or more clocking signals for the multiple electronic circuits. Those having ordinary skill in the art would understand that the present disclosure is not limited to generate the one or more clocking signals through resonant circuits, and the one or more RX modules may rely on the induced current and/or voltage itself as the one or more clocking signals without departing from the scope of the present disclosure.

Figure 1:
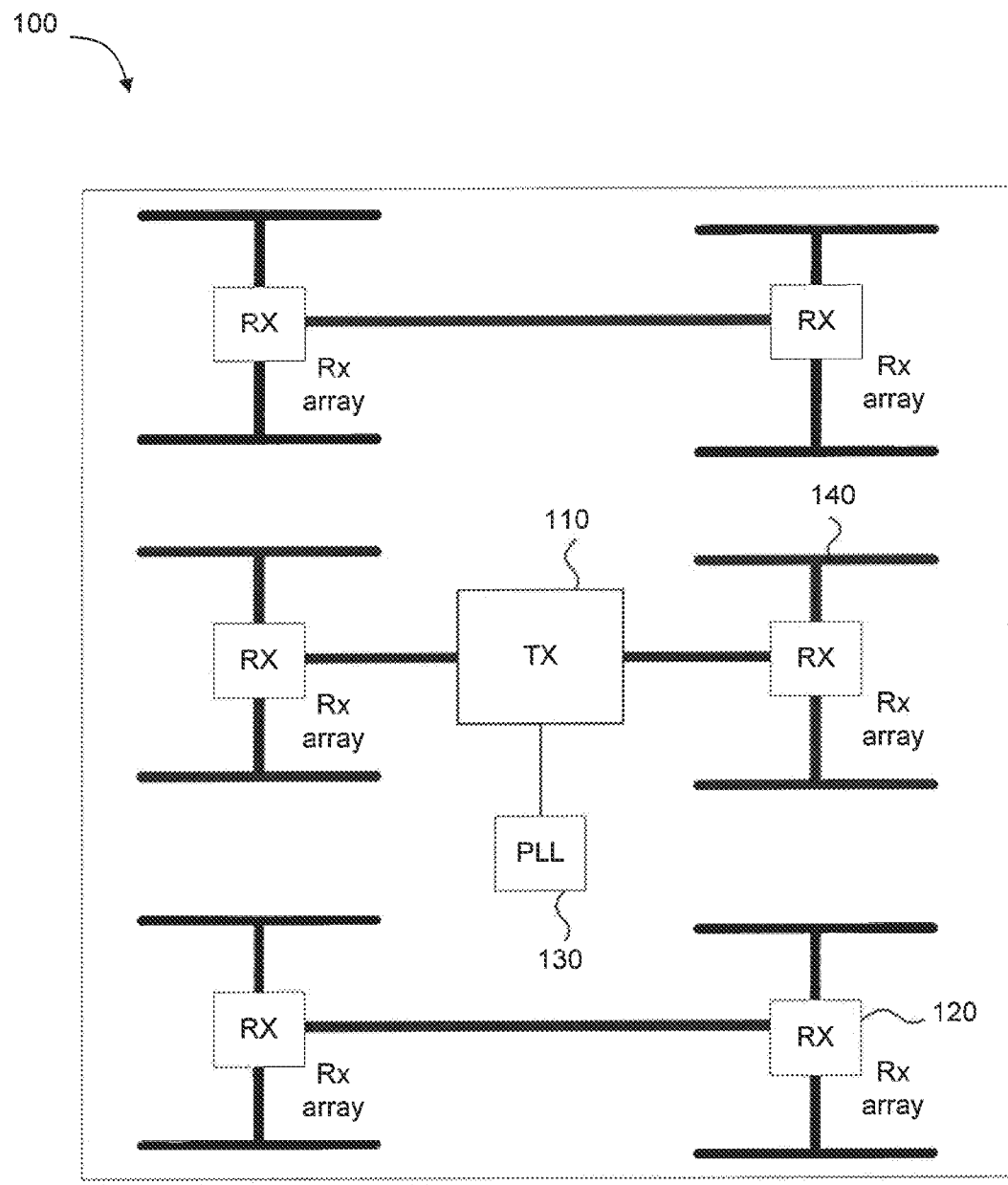
FIG. 1 is a block diagram illustrating elements of a clock distribution system according to an exemplary embodiment.

FIG. 1 is a diagram of a clock distribution system 100 according to an exemplary embodiment of the present disclosure. The clock distribution system 100 includes a TX module 110 that is inductively and/or capacitively coupled to a plurality of RX modules 120. The TX module 110 includes one or more transmission coupling elements, such as one or more inductors and/or capacitors, which upon receiving a clocking signal from a PLL 130, generate a magnetic field and/or an electrical field that is representative of the clocking signal. Each of the plurality of RX modules 120 include a respective one or more reception coupling elements, such as one or more inductors and/or capacitors, that induce a current and/or a voltage from the magnetic field and/or the electrical field respectively. In the exemplary embodiment, the one or more reception coupling elements are part of one or more resonant circuits within their respective plurality of RX modules 120 and the induced current and/or voltages cause their respective one or more resonant circuits to resonate to generate one or more clocking signals for a plurality of macros (i.e., electronic circuits) (not shown). Those having ordinary skill in the art would understand that the present disclosure is not so limited, and the one or more RX modules may rely on the induced current and/or voltage itself as the one or more clocking signals without departing from the scope of the present disclosure.

In operation, the PLL 130 provides the clocking signal to TX module 110 at a predetermined level (e.g., V=1.8V, f=2.0 GHz). The TX module 110 generates a magnetic field and/or an electrical field corresponding to the clocking signal. The magnetic field and/or the electrical field reach the plurality of RX modules 120 substantially simultaneously and, induce the current and/or the voltage within the plurality of RX modules 120 at substantially simultaneous instances in time. One or more resonant circuits within each of the plurality of RX modules 120 resonant provide a clocking signal for one or more electronic circuits attached thereto through, for example, an H-tree clock distribution configuration (140).

In the present embodiment, a clocking signal is distributed to a plurality of electronic circuits of a synchronous IC by using induction-coupled coils. However, this example is not limiting, those skilled in the relevant art(s) will recognize that other coupling elements can be used without departing from the spirit and scope of the present disclosure. During at least a portion of the distribution path between the PLL and the electronic circuits the clocking signal is carried by the magnetic field and/or the electrical field, and therefore, is not encumbered by discrete elements such as buffers and physical transmission lines. Accordingly, in the present embodiment, a clocking signal reaches corresponding electronic circuits virtually simultaneously and with significantly less clock skew than in a conventional system. Furthermore, because a clock distribution system according to the present embodiment does not require as many discrete elements as a conventional clock distribution system, such as buffers and transmission lines, more electronic circuits may be included in the semiconductor die than in a comparable IC using a conventional clock distribution. Further still, the reduction in discrete elements achieved by the present embodiment can significantly reduce the power consumption of the IC.

In the present embodiment, the PLL 130, the TX module 110, and the plurality of RX modules 120 are configured such that the clocking signal generated by RX modules 120 drives the electronic circuits coupled thereto without the need for local amplifying buffers along the distribution path. However, depending on factors such as, for example, possible interference with other electronic circuits, PLL clocking signal voltage, TX module inductance, RX module inductance, and TX module and RX module mutual inductance, etc., the clocking signal may not be strong enough to directly drive the clocked elements of the electronic circuits. Under those circumstances, a local buffer (not shown) may be included in the electronic circuits to amplify the clocking signal generated by the RX modules 120 and to drive the corresponding electronic circuits without departing from the scope of the present disclosure. The clock distribution system 100 is further described in U.S. patent application Ser. No. 13/849,115, filed Mar. 22, 2013, which is incorporated herein by reference in its entirety.

Figure 2:
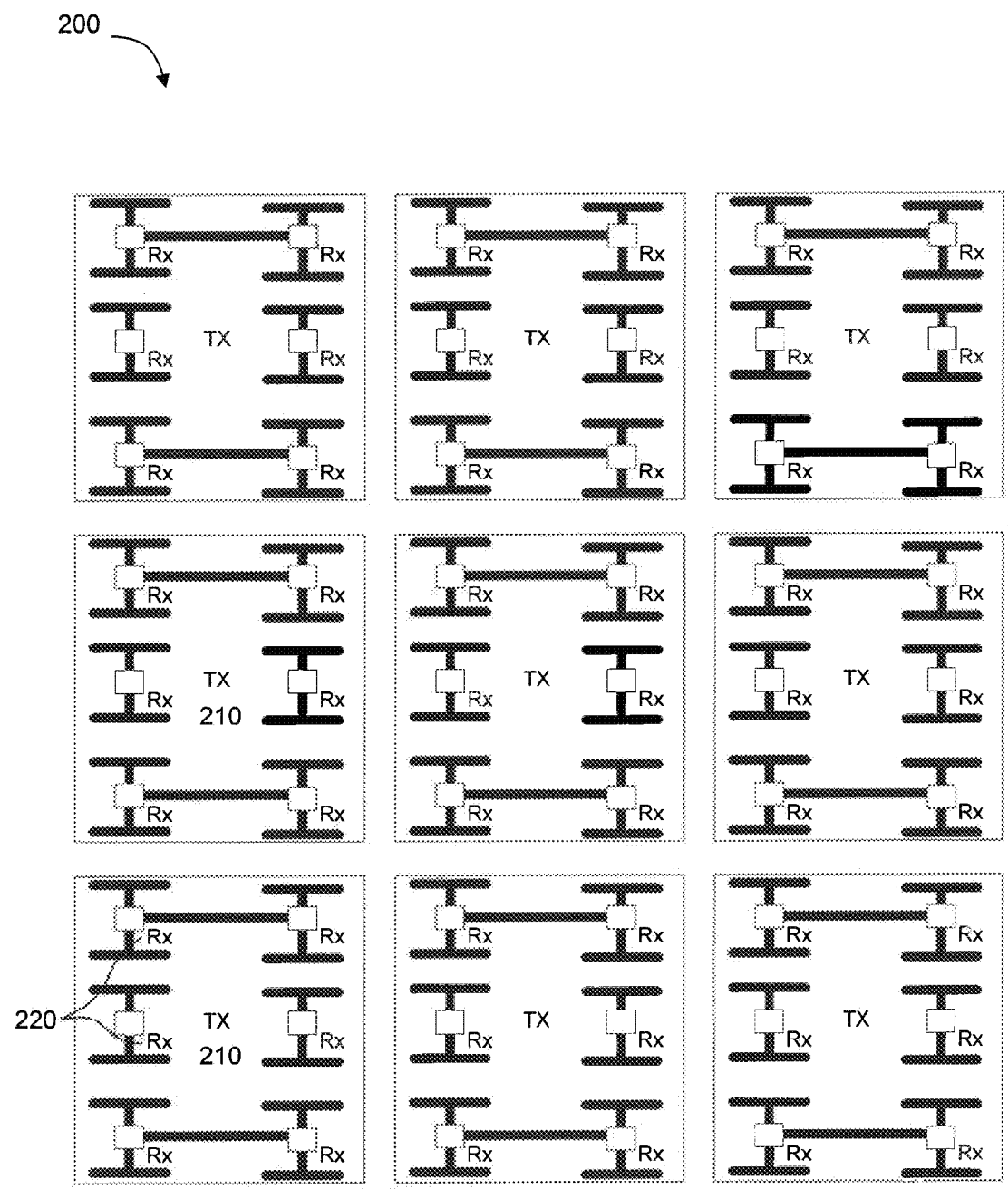
FIG. 2 is a block diagram illustrating elements of a clock distribution system according to another exemplary embodiment.

FIG. 2 is a diagram of an induction-clock distribution system 200 according to an exemplary embodiment of the present disclosure. Depending on the application in which an IC is used, it may not be desirable or practical to provide a clocking signal to all electronic circuits within the IC using only one TX module. For example, the magnitude of the magnetic field and/or the electrical field that may be necessary to properly drive all the electronic circuits of the IC may be high enough to disrupt operation of adjacent electronic circuits.

Accordingly, in the present exemplary embodiment, each TX module of a plurality of TX modules 210 distribute a clocking signal, via a respective magnetic field and/or a respective electrical field to a corresponding plurality of RX modules 220, which in turn, distribute the clocking signal to electronic circuits coupled thereto. In particular, a PLL (not shown) provides a clocking signal to the plurality of TX modules 210, which are disposed within the IC. Each TX module 210 then distributes the clocking signal to nearby RX modules 220 in the manner described with respect to FIG. 1. Thus, in the present embodiment, the magnitude of the magnetic field and/or the electrical field generated by each of the TX modules 210 to drive all the electronic circuits of the IC is less than what would be necessary from a single TX module 210 to properly reach all RX modules 220 and drive all the electronic circuits.

The present exemplary embodiment includes 9 TX modules 210, each TX module is disposed to distribute a clocking signal, through induction, to 6 RX modules 210. A person of ordinary skill in the art would understand that the amount of TX and RX modules may vary from that set forth in the present embodiment without departing from the spirit and scope of the present invention.

Figure 3A:
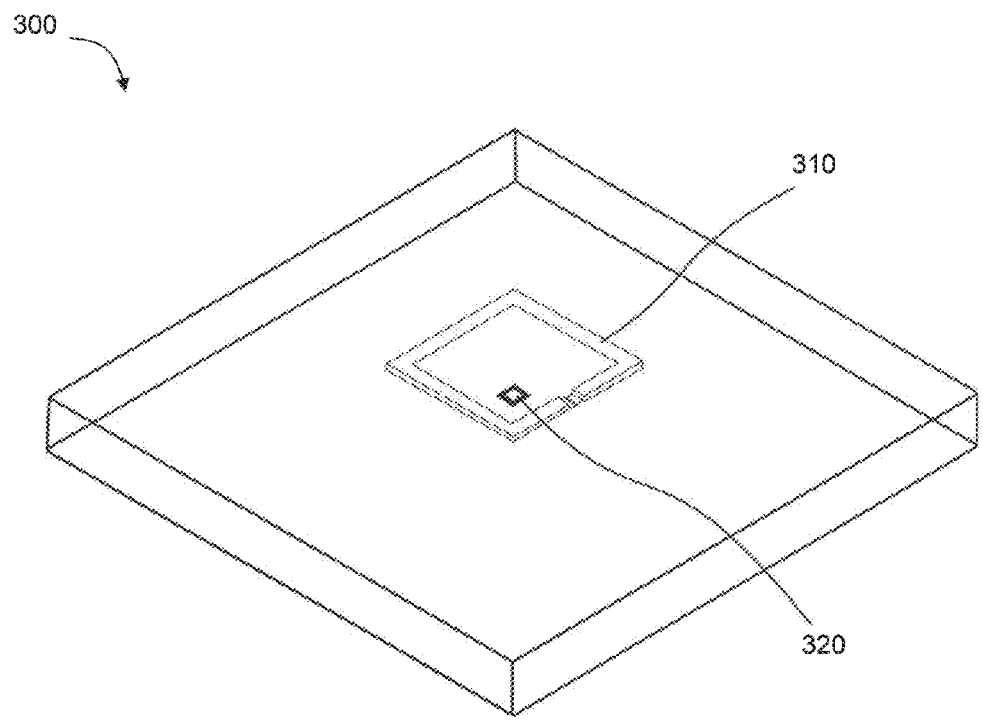
FIG. 3A is a diagram illustrating an IC package according to an exemplary embodiment.
Figure 3B:
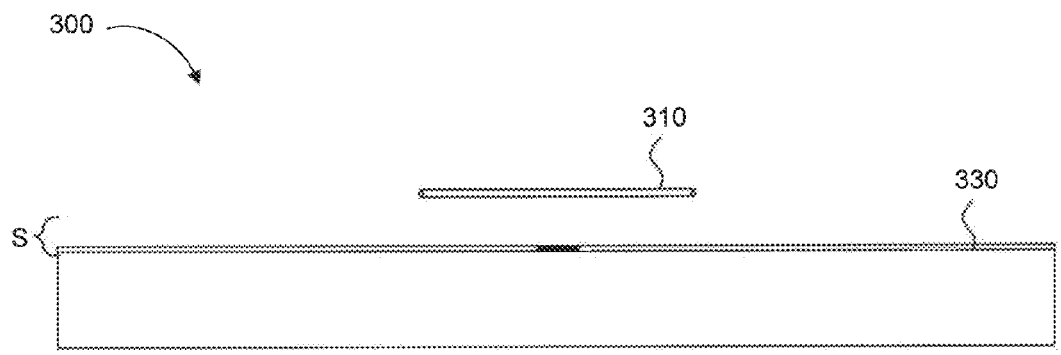
FIG. 3B is a diagram illustrating an IC package according to an exemplary embodiment.

FIGS. 3A and 3B show diagrammatic views of an IC package 300 according to an exemplary embodiment of the present disclosure. As it is known to those of ordinary skill in the art, semiconductor device fabrication includes a packaging process, in which an IC is encased in a supporting case, or "package," that protects electronic circuits therein from, for example, physical damage and corrosion.

In the present embodiment, a TX module having a TX coil 310 is disposed on the supporting case of the semiconductor device such that it lies on a plane parallel to, above, and slightly separated from, the a semiconductor die 330. Furthermore, a RX module having a RX coil 320 is disposed on semiconductor die 330, directly under TX coil 310 and coupled to electronic circuits therein (not shown). FIG. 3B shows a separation s between the TX coil 310 and the RX coil 320 more clearly.

Positioning the TX coil 310 on or within the supporting case may increase the coupling factor between the coils, and thus, improve their coupling. In particular, because, in general, the supporting case does not include other IC components, it provides a relatively large area in which the TX coil 310 can be easily disposed. Accordingly, the TX coil 310 may be configured as necessary, for example, with a large number of coil turns and/or close to the edge of the supporting case (or some other beneficial location), to increase the coupling with the RX coil 320. Furthermore, positioning the TX coil 310 in the supporting case may free space in the semiconductor die that would have been occupied by the TX coil 310 if it had been disposed on the semiconductor die. A person of ordinary skill in the art would understand that, in various exemplary embodiments, the TX coil may also be disposed on the semiconductor die or external to the supporting case, such as on another package stacked on top of the supporting case or in an interposer attached to the supporting case, without departing from the scope of the present disclosure. Furthermore the RX coil may be disposed on the package or in an interposer attached to the supporting case, without departing from the scope of the present disclosure.

Figure 4:
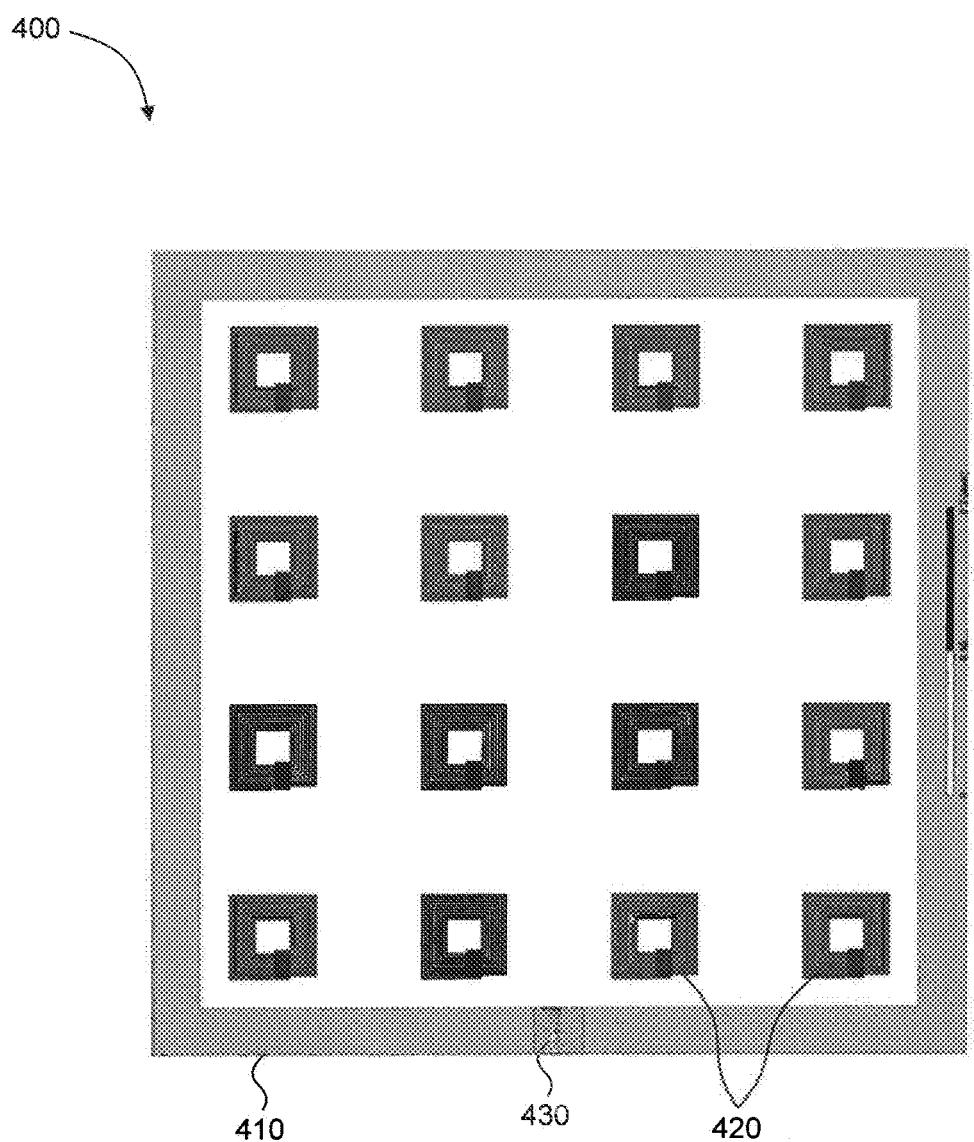
FIG. 4 is a diagram illustrating elements of a clock distribution system according to another exemplary embodiment.

FIG. 4 is a diagrammatic view including elements of an induction coupled clock distribution system 400 according to an exemplary embodiment of the present disclosure. In particular, a TX coil 410 is disposed such that the area within the coil includes 16 RX coils 420. The TX coil 410 may be located in the same vertical place as the RX coils 420, for example on the semiconductor die, or may be located in a different horizontal plane, for example, within the package of the semiconductor device, above the RX coils 420 and the semiconductor die. A PLL (not shown) may be coupled to the TX coil 410 at a connecting area 430.

In operation, a clocking signal provided to the TX coil 410 through connecting area 430 travels through TX coil 410 to generate a magnetic field. Each of the plurality of RX coils 420 induces a current from the magnetic field. In the exemplary embodiment, the RX coils 420 are part of one or more resonant circuits within their respective plurality of RX modules. These induced currents cause their respective one or more resonant circuits to resonate to generate one or more clocking signals for a plurality of macros (i.e., electronic circuits) (not shown).). Those having ordinary skill in the art would understand that the present disclosure is not so limited, and the RX modules may rely on the induced current and/or voltage itself as the one or more clocking signals without departing from the scope of the present disclosure.

Although the present embodiment illustrates only 1 TX coil and 16 RX coils, a person of ordinary skill in the art would understand that the amount of TX and RX coils may vary from that set forth in the present embodiment. For example, a semiconductor device may include a plurality of structures like the one shown in FIG. 4, as illustrated in FIG. 2, without departing from the scope of the present disclosure. Furthermore, an exemplary TX coil consistent with the present disclosure may measure 1 mm by 1 mm. However, a TX coil consistent with the present disclosure may be larger or smaller, depending on factors such as the PLL clocking signal voltage, inductance, RX coil inductance, TX coil and RX coil mutual inductance, etc.

CONCLUSION

The exemplary embodiments described herein are provided for illustrative purposes, and are not limiting. Other exemplary embodiments are possible, and modifications may be made to the exemplary embodiments within the spirit and scope of the disclosure.

It is to be appreciated that the Detailed Description section, and not the Abstract section, is intended to be used to interpret the claims. The Abstract section may set forth one or more, but not all exemplary embodiments, of the disclosure, and thus, are not intended to limit the disclosure and the appended claims in any way.

The disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail of the disclosure can be made therein without departing from the spirit and scope of the disclosure. Thus the disclosure should not be limited by any of the above-described exemplary embodiments. Further, the claims should be defined only in accordance with the following recitations and their equivalents.

What is claimed:

1. An integrated circuit package, comprising:
   a transmission module, including a transmission coil, coupled to a main clock line;
   a semiconductor die;
   a clock reception module including a reception coil and a clock output line, the reception coil disposed on the semiconductor die and inductively coupled to the transmission coil of the transmission module to generate a clocking signal on the clock output line;
   an electronic circuit disposed on the semiconductor die and coupled to the clock output line of the clock reception module, the electronic circuit comprising at least one clocked element, and configured to operate synchronously with the clocking signal received through the clock output line of the clock reception module; and
   a supporting case configured to enclose the semiconductor die, the supporting case comprising the transmission module in a plane parallel and above the semiconductor die.

2. The integrated circuit package of claim 1, wherein the transmission module is disposed within the supporting case.

3. The integrated circuit package of claim 2, wherein the electronic circuit comprises:
   a buffer amplifier coupled to the clock output line of the clock reception module and coupled to the at least one clocked element of the electronic circuit.

4. The integrated circuit package of claim 1, wherein the transmission module is disposed on the supporting case.

5. The integrated circuit package of claim 4, wherein the electronic circuit comprises:
   a buffer amplifier coupled to the clock output line of the clock reception module and coupled to the at least one clocked element of the electronic circuit.

6. The integrated circuit package of claim 1, further comprising one of a phase lock loop unit and a voltage controlled oscillator coupled to the main clock line.

7. The integrated circuit package of claim 1, the transmission module comprising a transmission coil, and the clock reception module comprising a resonant circuit, wherein
   the inductive coupling of the transmission module and the clock reception module comprises an inductive coupling of the transmission coil and the resonant circuit, and
   the clock reception module is configured to generate the clocking signal based on a resonance of the resonant circuit.

8. An integrated circuit package comprising:
   a semiconductor die;
   a supporting case configured to enclose the semiconductor die;
   a transmission module coupled to a main clock line and disposed on a plane of the supporting case parallel to the semiconductor die along the perimeter of the supporting case;
   a plurality of clock reception modules inductively coupled to the transmission module and disposed on the semiconductor die, each clock reception module comprising a clock output line; and
   a plurality of electronic circuits disposed on the semiconductor die, each electronic circuit coupled to the clock output line of a corresponding clock reception module of the plurality of clock reception modules, each electronic circuit comprising at least one clocked element and configured to operate synchronously with a clocking signal received through the corresponding clock output line;
   wherein at least one electronic circuit of the plurality of electronic circuits comprises a buffer amplifier coupled to the clock output line of the corresponding clock reception module and coupled to the at least one clocked element of the at least one electronic circuit.

9. The integrated circuit package of claim 8, the plane of the supporting case including the transmission module being disposed within the supporting case, above the semiconductor die.

10. The integrated circuit package of claim 8, the plane of the supporting case including the transmission module being disposed on the supporting case.

11. The integrated circuit package of claim 8, further comprising one of a phase lock loop unit and a voltage controlled oscillator coupled to the main clock line.

12. The integrated circuit package of claim 8, the transmission module comprising a transmission coil, and each clock reception module of the plurality of clock reception modules comprising a reception coil, wherein
   the inductive coupling of the transmission module and the plurality of clock reception modules comprises an inductive coupling of the transmission coil and the reception coil of each clock reception module of the plurality of clock reception modules, and
   each clock reception module of the plurality of clock reception modules is configured to generate a corresponding clocking signal based on the induction coupling of the transmission coil and the corresponding reception coil.

13. An integrated circuit package, comprising:
   a semiconductor die;
   a supporting case configured to enclose the semiconductor die;
   a plurality of clock reception modules disposed on the semiconductor die, each clock reception module comprising a clock output line;
   a plurality of transmission modules coupled to a main clock line, disposed on a plane of the supporting case parallel to the semiconductor die, and each transmission module of the plurality of transmission modules inductively coupled to at least one clock reception module of the plurality of clock reception modules; and a plurality of electronic circuits disposed on the semiconductor die, each electronic circuit coupled to the clock output line of a corresponding clock reception module of the plurality of clock reception modules, each electronic circuit comprising at least one clocked element and configured to operate synchronously with a clocking signal received through the corresponding clock output line;

wherein one of a phase lock loop unit and a voltage controlled oscillator is coupled to the main clock line.

14. The integrated circuit package of claim 13, at least one electronic circuit further comprising a buffer amplifier coupled to the clock output line of the corresponding clock reception module and coupled to the at least one clocked element of the electronic circuit.

15. The integrated circuit package of claim 13, the plane of the supporting case including the plurality of transmission modules being disposed within the supporting case, above the semiconductor die.

16. The integrated circuit package of claim 13, the plane of the supporting case including the plurality of transmission modules being disposed on the supporting case.

17. The integrated circuit package of claim 13, each transmission module of the plurality of transmission modules comprising a transmission coil, and each clock reception module of the plurality of clock reception modules comprising a reception coil, wherein the inductive coupling of each transmission module of the plurality of transmission modules and the at least one clock reception module of the plurality of clock reception modules comprises an inductive coupling of the transmission coil of the corresponding transmission module of the plurality of transmission modules and the reception coil of the corresponding at least one clock reception module of the plurality of clock reception modules, and each clock reception module of the plurality of clock reception modules is configured to generate a corresponding clocking signal based on the corresponding induction coupling.

18. The integrated circuit package of claim 1, wherein the transmission coil includes one or more coil turns, at least one of the one or more coil turns disposed along a perimeter of the supporting case.

19. The integrated circuit package of claim 1, wherein the transmission coil is disposed on an interposer attached to the supporting case.

20. The integrated circuit package of claim 13, wherein each transmission module includes a corresponding transmission coil that generates at least a portion of a magnetic field that induces the clocking signal received through the corresponding clock output line.

* * * * *